(12) United States Patent
Kim et al.

(10) Patent No.: US 12,075,658 B2
(45) Date of Patent: Aug. 27, 2024

(54) ORGANIC LIGHT-EMITTING DISPLAY APPARATUS WITH FOCUS LENS

(71) Applicant: SAMSUNG DISPLAY CO., LTD., Yongin-si (KR)

(72) Inventors: Jinyeong Kim, Yongin-si (KR); Sangho Park, Yongin-si (KR); Jintaek Kim, Yongin-si (KR); Mijin Park, Yongin-si (KR); Soohyun Moon, Yongin-si (KR); Taehoon Yang, Yongin-si (KR); Kwangtaek Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/174,180

(22) Filed: Feb. 24, 2023

(65) Prior Publication Data

US 2023/0209912 A1    Jun. 29, 2023

Related U.S. Application Data

(63) Continuation of application No. 17/013,149, filed on Sep. 4, 2020, now Pat. No. 11,610,950.

(30) Foreign Application Priority Data

Jan. 20, 2020    (KR) .......................... 10-2020-0007382

(51) Int. Cl.
*H10K 59/122* (2023.01)
*H10K 50/15* (2023.01)
(Continued)

(52) U.S. Cl.
CPC ............ *H10K 59/122* (2023.02); *H10K 50/15* (2023.02); *H10K 50/858* (2023.02); *H10K 59/121* (2023.02)

(58) Field of Classification Search
CPC ...................................................... H10K 59/122
See application file for complete search history.

(56) References Cited

U.S. PATENT DOCUMENTS 8,592,833 B2    11/2013    Lee et al.
8,748,924 B2    6/2014    Shiozaki
(Continued)

FOREIGN PATENT DOCUMENTS

CN    102237392 A    11/2011
CN    108573993 A    9/2018
(Continued)

*Primary Examiner* — Peter Bradford
(74) *Attorney, Agent, or Firm* — F. CHAU & ASSOCIATES, LLC

(57) ABSTRACT

In an organic light-emitting display apparatus in which color mixing is reduced, the organic light-emitting display apparatus includes a substrate, a plurality of pixel electrodes disposed on the substrate to be apart from each other, a pixel defining layer disposed on the substrate and covering an edge of each of the plurality of pixel electrodes to expose a center portion of each of the plurality of pixel electrodes, and a plurality of spacers disposed on the pixel defining layer to be apart from each other, in which a distance between an edge of each of the plurality of spacers in a direction toward a closest pixel electrode and a portion or the closest pixel electrode that is not covered by the pixel defining layer is about 3 μm or less.

14 Claims, 4 Drawing Sheets

(51) Int. Cl.
*H10K 50/858* (2023.01)
*H10K 59/121* (2023.01)

(56) References Cited

U.S. PATENT DOCUMENTS

| | | | |
|---|---|---|---|
| 8,829,525 B2 | 9/2014 | Kim | |
| 9,166,166 B2 | 10/2015 | Kim et al. | |
| 9,627,457 B2 | 4/2017 | Lee | |
| 9,627,654 B2 | 4/2017 | Shim et al. | |
| 9,704,926 B2 | 7/2017 | Kim | |
| 10,186,680 B2 | 1/2019 | Lee | |
| 11,056,544 B1 | 7/2021 | Wei et al. | |
| 2008/0063949 A1* | 3/2008 | Inoue | H05B 33/26 430/7 |
| 2010/0033084 A1* | 2/2010 | Ko | H10K 50/11 445/24 |
| 2010/0207107 A1 | 8/2010 | Kim | |
| 2011/0233570 A1* | 9/2011 | Lee | H10K 50/844 257/E51.018 |
| 2011/0260954 A1 | 10/2011 | Noh et al. | |
| 2012/0292621 A1 | 11/2012 | Kim et al. | |
| 2014/0027729 A1* | 1/2014 | So | H10K 50/16 438/34 |
| 2014/0084257 A1 | 3/2014 | Kim et al. | |
| 2014/0145157 A1 | 5/2014 | Kim et al. | |
| 2014/0220715 A1 | 8/2014 | Kang | |
| 2015/0102292 A1 | 4/2015 | Kim | |
| 2015/0123102 A1 | 5/2015 | Jeon | |
| 2016/0133677 A1 | 5/2016 | Yamamoto et al. | |
| 2017/0040393 A1 | 2/2017 | Onimaru | |
| 2017/0077448 A1* | 3/2017 | Sakamoto | H10K 50/805 |
| 2018/0261797 A1 | 9/2018 | Lee | |
| 2019/0198588 A1 | 6/2019 | Moon et al. | |
| 2019/0393415 A1 | 12/2019 | Kim et al. | |
| 2020/0119112 A1* | 4/2020 | Chen | H10K 71/166 |
| 2021/0225969 A1 | 7/2021 | Kim et al. | |

FOREIGN PATENT DOCUMENTS

| | | | |
|---|---|---|---|
| CN | 109962090 A | 7/2019 | |
| JP | 2004192977 A * | 7/2004 | H01L 27/3246 |
| JP | 2013-114773 | 6/2013 | |
| JP | 5743669 | 5/2015 | |
| KR | 10-2010-0093221 | 8/2010 | |
| KR | 10-2011-0106733 | 9/2011 | |
| KR | 10-2014-0124285 | 10/2014 | |
| KR | 10-2015-0005264 | 1/2015 | |
| KR | 10-2015-0067624 | 6/2015 | |
| KR | 10-2016-0034458 | 3/2016 | |
| KR | 20180065386 A * | 6/2018 | |
| KR | 10-2018-0104225 | 9/2018 | |

* cited by examiner

ORGANIC LIGHT-EMITTING DISPLAY APPARATUS WITH FOCUS LENS

CROSS-REFERENCE TO RELATED APPLICATION

This application is a continuation of U.S. application Ser. No. 17/013,149 filed on Sep. 4, 2020 which claims the benefit of Korean Patent Application No. 10-2020-0007382, filed on Jan. 20, 2020, in the Korean Intellectual Property Office, the disclosure of which is incorporated by reference herein in its entirety.

BACKGROUND

1. Field

The present inventive concept relates to an organic light-emitting display apparatus, and more particularly, to an organic light-emitting display apparatus in which color mixing is reduced.

2. Description of Related Art

In general, an organic light-emitting display apparatus may have a structure in which an intermediate layer including an emission layer is disposed between a pixel electrode and a counter electrode. The intermediate layer may be formed through deposition and may include various layers. Among layers included in the intermediate layer, layers that are to be integrally formed are simultaneously formed in a plurality of pixels by using a mask called an open mask. For an emission layer, as a red emission layer is formed only in a pixel to emit red light, and a green emission layer is formed only in a pixel to emit green light, the red and green emission layers are formed only in particular pixels by using a fine metal mask.

SUMMARY

The above-described organic light-emitting display apparatus has a problem in that a material for an emission layer to be formed in a particular pixel in a manufacturing process is disposed adjacent to another pixel or at another pixel, and thus, color mixing may occur when an image is formed after a display apparatus is completed.

One or more embodiments include an organic light-emitting display apparatus in which color mixing is reduced. However, the embodiments are exemplary, and the scope of the disclosure is not limited thereto.

Additional aspects will be set forth in part in the description which follows and, in part, will be apparent from the description, or may be learned by practice of the presented embodiments of the disclosure.

According to an exemplary embodiment of the present invention, an organic light-emitting display apparatus includes a substrate, a plurality of pixel electrodes disposed on the substrate to be spaced apart from each other, a counter electrode disposed on the plurality of pixel electrodes, a pixel defining layer disposed on the substrate and including a plurality of pixel defining holes exposing the plurality of pixel electrodes, each of the plurality of pixel defining holes exposing a center portion of a corresponding pixel electrode of the plurality of pixel electrodes, and a plurality of spacers disposed on the pixel defining layer to be spaced apart from each other. Each of the plurality of spacers is disposed between the pixel defining layer and the counter electrode.

A distance between an edge of each of the plurality of spacers adjacent to a closest pixel electrode and a portion of the closest pixel electrode that is not covered by the pixel defining layer is up to about 3 μm.

A distance between an edge of each of the plurality of spacers adjacent to a closest pixel electrode and a portion of the closest pixel electrode that is not covered by the pixel defining layer is between about 1 μm and about 3 μm.

A distance between an edge of each of the plurality of spacers adjacent to a closest pixel electrode and a portion of the closest pixel electrode that is not covered by the pixel defining layer is about 2 μm.

Each of the plurality of spacers is disposed between a corresponding pixel electrode of the plurality of pixel electrodes and one of pixel electrodes closest to the corresponding pixel electrode.

The plurality of pixel electrodes are disposed at intersections of a plurality of first virtual linear lines parallel to each other and a plurality of second virtual linear lines parallel to each other and crossing the plurality of first virtual linear lines. The plurality of spacers include a plurality of first spacers that are disposed on the plurality of first virtual linear lines and a plurality of second spacers that are disposed on the plurality of second virtual linear lines. Each of the plurality of first spacers is disposed between two adjacent pixel electrodes, arranged on a corresponding first virtual linear line of the plurality of first virtual linear lines, of the plurality of pixel electrodes. Each of the plurality of second spacers is disposed between two adjacent pixel electrodes, arranged on a corresponding second virtual linear line of the plurality of second virtual linear lines, of the plurality of pixel electrodes.

A portion of an upper surface of the pixel defining layer between one pixel electrode of the plurality of pixel electrodes and one of pixel electrodes second closest to the one pixel electrode contacts a hole injection layer or a hole transport layer.

Each of the plurality of pixel electrodes is surrounded by four spacers closest thereto.

The organic light-emitting display apparatus of claim 1 further includes an auxiliary layer disposed on a side surface of each of the plurality of spacers, the auxiliary layer including a material that is the same as a material of an emission layer disposed on a pixel electrode closest to the auxiliary layer.

The auxiliary layer is integrally formed with the emission layer.

The organic light-emitting display apparatus further includes a plurality of thin film transistors disposed over the substrate, and a planarization layer covering the plurality of thin film transistors and having a plurality of via holes for exposing any one of a source electrode and a drain electrode of each of the plurality of thin film transistors. The plurality of pixel electrodes are disposed on the planarization layer. The plurality of pixel electrodes are electrically connected to the plurality of thin film transistors through the plurality of via holes, respectively. An emission layer disposed on one pixel electrode of the plurality of pixel electrodes is disposed on a portion of the one pixel electrode contacting a corresponding one of the plurality of thin film transistors.

The organic light-emitting display apparatus further includes a focusing lens disposed over the one pixel electrode and focusing light generated from the emission layer and proceeding in a direction away from the pixel electrode.

A center of the focusing lens may match a center of the portion of the one pixel electrode, the portion contacting a corresponding one of the plurality of thin film transistors.

According to an exemplary embodiment of the present inventive concept, an organic light-emitting display apparatus includes a substrate, a pixel electrode disposed on the substrate, a pixel defining layer disposed on the substrate and including a pixel defining hole exposing the pixel electrode, a counter electrode disposed on the pixel electrode and the pixel defining layer, a pair of first spacers disposed on the pixel defining layer and spaced apart from each other in a first direction, the pixel defining hole disposed between the pair of first spacers and each of the pair of first spacers disposed between the pixel defining layer and the counter electrode, and a pair of second spacers disposed on the pixel defining layer and spaced apart from each other in a second direction different from the first direction, the pixel defining hole disposed between the pair of second spacers and each of the pair of second spacers disposed between the pixel defining layer and the counter electrode.

An edge of each of the pair of first spacers is spaced, at a first distance, apart from a corresponding edge of the pixel electrode exposed by the pixel defining hole. The first distance is measured in the first direction on a top down view, and the first distance is between about 1 μm and about 3 μm.

An edge of each of the pair of second spacers is spaced, at a second distance, apart from a corresponding edge of the pixel electrode exposed by the pixel defining hole at a second distance. The second distance is measured in the second direction on a top down view, and the second distance is between about 1 μm and about 3 μm.

No spacer is present on a region adjacent, in the second direction, to one of the pair of first spacers and adjacent, in the first direction, to one of the pair of second spacers.

The organic light-emitting display apparatus further includes an emission layer disposed on the pixel electrode, and an auxiliary layer disposed on a side surface of each of the pair of first spacers, the auxiliary layer including a material that is the same as a material of the emission layer.

Other aspects, features, and advantages will become apparent and more readily appreciated from the following description of the embodiments, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
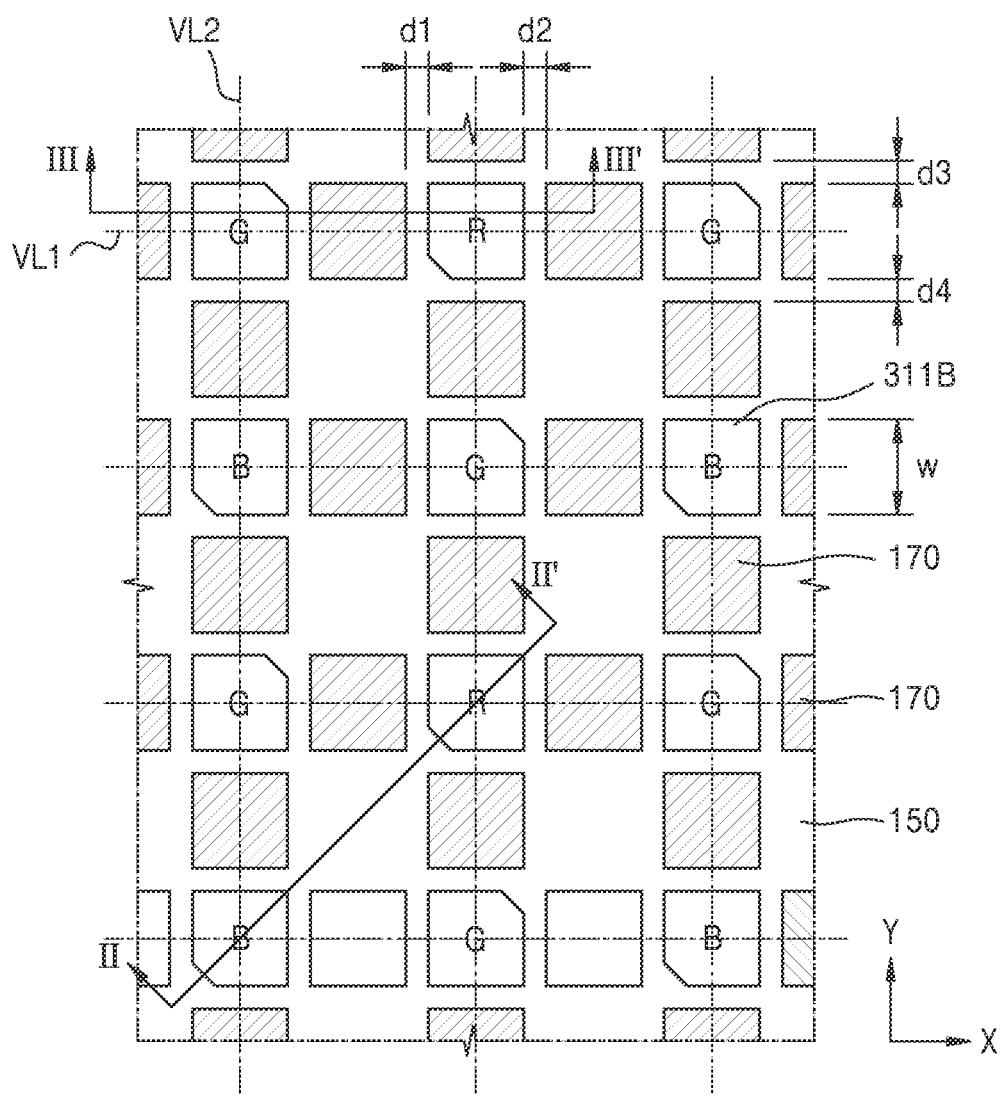
FIG. 1 is a plan view schematically illustrating a portion of an organic light-emitting display apparatus according to an exemplary embodiment of the present inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present disclosure will be described in detail by explaining embodiments of the disclosure with reference to the attached drawings. Like reference numerals in the drawings denote like elements, and redundant explanations thereof are omitted.

It will be understood that when a component, such as a layer, a film, a region, or a plate, is referred to as being "on" another component, the component can be directly on the other component or intervening components may be present thereon. Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
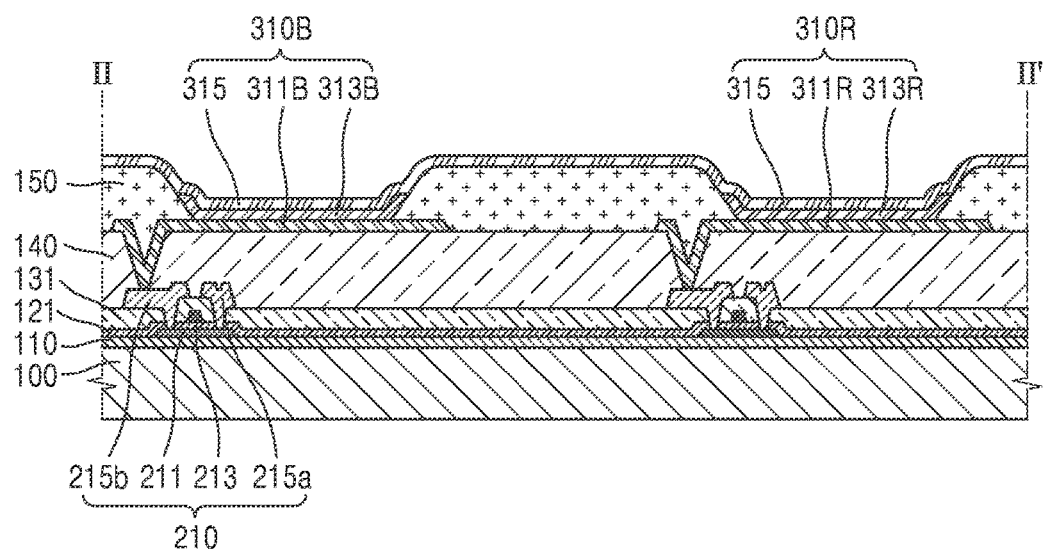
FIG. 2 is a schematic cross-sectional view taken along line II-II' of FIG. 1 according to an exemplary embodiment of the present inventive concept.
Figure 3:
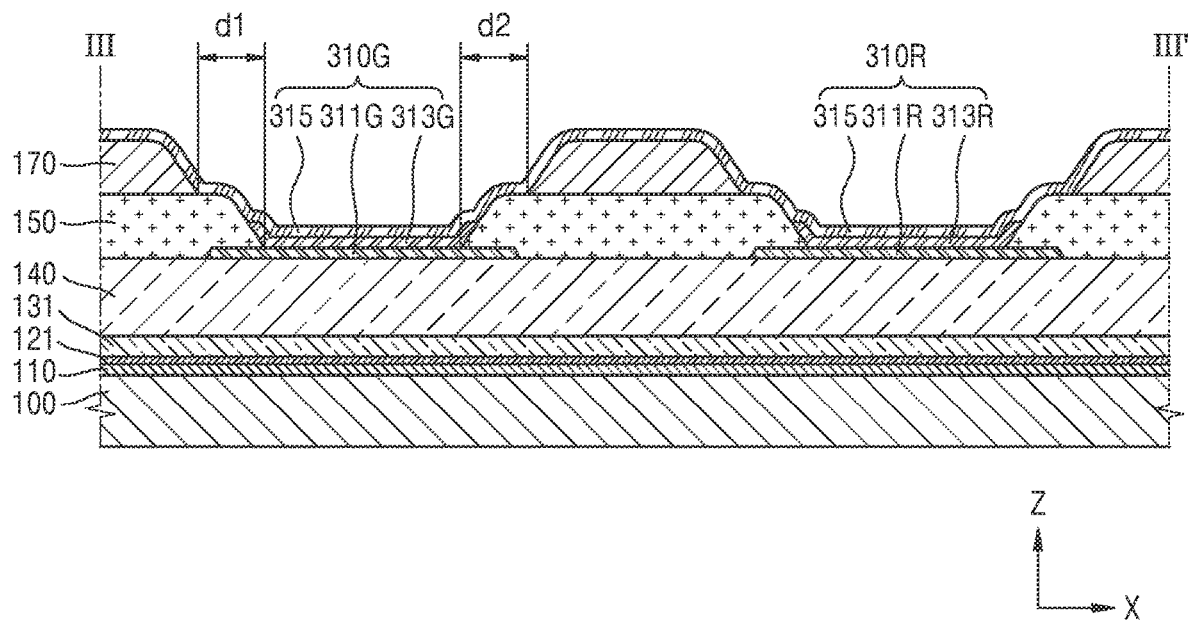
FIG. 3 is a schematic cross-sectional view taken along line III-III' of FIG. 1 according to an exemplary embodiment of the present inventive concept.

FIG. 1 is a plan view schematically illustrating a portion of an organic light-emitting display apparatus according to an exemplary embodiment of the present inventive concept. FIG. 2 is a schematic cross-sectional view taken along line II-II' of FIG. 1. FIG. 3 is a schematic cross-sectional view taken along line III-III' of FIG. 1. In FIG. 1, each pixel is one of a red pixel R, a green pixel G, and a blue pixel B. In FIG. 2, a blue organic light-emitting device 310B and a red organic light-emitting device 310R are illustrated, and in FIG. 3, a green organic light-emitting device 310G and the red organic light-emitting device 310R are illustrated. While FIG. 2 illustrates a thin film transistor 210, FIG. 3 does not illustrate the thin film transistor 210 for the simplicity of drawings. The thin film transistor 210 of FIG. 2 is a driving thin film transistor. Other thin film transistors or capacitors, or various wrings, may be in each pixel. While FIG. 2 illustrates, for convenience of explanation, only the driving thin film transistor 210, other thin film transistors or capacitors, or wirings, may be disposed on a substrate 100. In FIG. 3, other thin film transistors or capacitors, or wirings, may be disposed on the substrate 100.

An organic light-emitting display apparatus according to the present embodiment is provided with pixel electrodes 311R, 311G, and 311B that are arranged on the substrate 100 and spaced apart from each other.

The substrate 100 may include glass, metal, or polymer resin. When the organic light-emitting display apparatus is flexible or bendable at a portion, the substrate 100 may be flexible or bendable. In this case, the substrate 100 may include polymer resin, for example, polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have, for example, a multilayered structure including two layers, each including polymer resin, and a barrier layer disposed between the two layers. In an exemplary embodiment, the barrier layer may include an inorganic material such as a silicon oxide, a silicon nitride, or a silicon oxynitride. The structure of substrate 100 may be variously modified.

Various constituent elements may be disposed between the substrate 100 and the pixel electrodes 311R, 311G, and 311B. For example, as illustrated in FIG. 2, the thin film transistor 210 may be disposed on the substrate 100.

The thin film transistor 210 may include a semiconductor layer 211 including amorphous silicon, polycrystal silicon, or an organic semiconductor material, a gate electrode 213, a source electrode 215a, and a drain electrode 215b. The gate electrode 213 may include various conductive materials and have various layered structure. In an exemplary embodiment, the gate electrode 213 may include a Mo layer, an Al layer or a combination thereof. The source electrode 215a and the drain electrode 215b may also include various conductive materials and various layered structures. In an exemplary embodiment, each of the source electrode 215a and the drain electrode 215b may include a Ti layer, an Al layer or a combination thereof.

To secure insulation between the semiconductor layer 211 and the gate electrode 213, a gate insulating film 121 may be disposed between the semiconductor layer 211 and the gate electrode 213, the gate insulating film 121 including an inorganic material such as silicon oxide, silicon nitride, and/or silicon oxynitride. For the convenience of description and the simplicity of drawings, the gate insulating film 121 is shown as not included in the thin film transistor 210. The present inventive concept is not limited thereto. For example, a portion of the gate insulating film 121 disposed between the gate electrode 213 and the semiconductor layer 211 may be referred to as a constituent element of the thin film transistor 210. In addition, an interlayer insulating film 131 may be disposed on the gate electrode 213, the interlayer insulating film 131 including an inorganic insulating material such as silicon oxide, silicon nitride, and/or silicon oxynitride. The source electrode 215a and the drain electrode 215b may be disposed on the interlayer insulating film 131. The inorganic insulating material of the interlayer insulating film 131 may be formed through chemical vapor deposition (CVD) or atomic layer deposition (ALD). This applies to the below-described embodiments and modified examples thereof.

A buffer layer 110 may be disposed between the thin film transistor 210 and the substrate 100, the buffer layer 110 including an inorganic material such as silicon oxide, silicon nitride, and/or silicon oxynitride. The buffer layer 110 may serve to provide a planarized surface for a subsequent process of, for example, forming the thin film transistor or prevent or reduce intrusion of impurities from the substrate 100 into the semiconductor layer 211 of the thin film transistor 210. In an exemplary embodiment, the buffer layer 110 may be disposed between the substrate 100 and the semiconductor layer 211 and between the substrate 100 and the gate insulating film 121.

A planarization layer 140 may be disposed on the thin film transistor 210. For example, as illustrated in FIG. 2, before an organic light-emitting device is disposed above the thin film transistor 210, the planarization layer 140 may approximately planarize an upper surface of the thin film transistor 210 or an upper surface of a protection film (not shown) covering the thin film transistor 210. For example, the planarization layer 140 may serve to provide a planarized surface for a subsequent process of, for example, forming the organic light-emitting device. The planarization layer 140 may include, for example, an organic material such as acryl, benzocyclobutene (BCB), or hexamethyldisiloxane (HMDSO). Although FIGS. 2 and 3 illustrate the planarization layer 140 as a single layer, various modifications, for example, a multilayer, may be possible.

The organic light-emitting display apparatus may have an organic light-emitting device in each pixel. Each organic light-emitting device may include a pixel electrode, a counter electrode 315 (i.e., a common electrode), and an intermediate layer disposed therebetween. In an exemplary embodiment, the intermediate layer may include an emission layer. A pixel in FIG. 1 does not mean a pixel electrode, but the pixel means an area where the pixel electrode and the intermediate layer contact each other. For example, in FIG. 1, each pixel may refer to a contact area between the pixel electrode and the intermediate layer. The contact area may be defined by an opening of a pixel defining layer 150, which will be described later.

The pixel electrodes 311R, 311G, and 311B may be disposed above the planarization layer 140 and may have a single layer structure or a multi-layer structure. For a multi-layer structure, each pixel electrode may include a conductive layer such as indium tin oxide (ITO), indium zinc oxide (IZO), or indium oxide ($In_2O_3$) and a conductive layer such as Al or Cu. The pixel electrodes 311R, 311G, and 311B may contact directly or indirectly any one of the source electrode 215a and the drain electrode 215b of the thin film transistor 210 corresponding thereto via a via hole formed in the planarization layer 140.

A pixel defining layer 150 may be disposed on the planarization layer 140. The pixel defining layer 150 has an opening corresponding to each pixel, that is, an opening exposing at least a center portion of each of the pixel electrodes 311R, 311G, and 311B, thereby defining a pixel. Portions indicated by R, G, and B in FIG. 1 are respective parts of the pixel electrodes 311R, 311G, and 311B, which are exposed and not covered by the pixel defining layer 150.

Furthermore, as illustrated in FIGS. 2 and 3, the pixel defining layer 150 may prevent generation of an arc at the edges of the pixel electrodes 311R, 311G, and 311B by increasing a distance between the edge of each of the pixel electrodes 311R, 311G, and 311B and the counter electrode 315 above the pixel electrodes 311R, 311G, and 311B. The pixel defining layer 150 may include an organic material such as polyimide or hexamethyldisiloxane (HMDSO).

Intermediate layers 313R, 313G, and 313B of the organic light-emitting device may include a low molecular weight or polymer material. When the intermediate layers 313R, 313G, and 313B include a low molecular weight material, the intermediate layers 313R, 313G, and 313B may have a hole injection layer (HIL), a hole transport layer (HTL), an emission layer (EML), an electron transport layer (ETL), and an electron injection layer (EIL) as a structure that is stacked in a single or composite structure, by using a vacuum deposition method. When the intermediate layers 313R, 313G, and 313B include a polymer material, the intermediate layers 313R, 313G, and 313B may have a structure including an HTL and an EML. In this case, the HTL may include PEDOT, the EML may include a polymer material such as a poly-phenylenevinylene (PPV)-based material and a polyfluorene-based material. The intermediate layers 313R, 313G, and 313B may be formed by a deposition method using a mask, and the EML may be formed by a deposition method or an inkjet printing method. The intermediate layers 313R, 313G, and 313B are not necessarily limited thereto, and may have various structures. The intermediate layers 313R, 313G, and 313B may include an integral layer over the pixel electrodes 311R, 311G, and 311B. The present inventive concept is not limited thereto. In an embodiment, a layer, for example, an EML, may be patterned so that the EML is separately disposed on a corresponding pixel of the pixel electrodes 311R, 311G, and 311B. In the following description, the reference numerals 313R, 313G, and 313B are used to refer to an EML for the convenience.

The counter electrode 315 may be formed integrally to the red, green, and blue organic light-emitting devices 310R, 310G, and 310B to correspond to the pixel electrodes 311R, 311G, and 311B. The counter electrode 315 covers a display area and extends to a peripheral area outside the display area.

As the organic light-emitting device may be easily damaged by external moisture or oxygen, an encapsulation layer (not shown) may cover and protect the organic light-emitting device. The encapsulation layer may cover the display area and extend to at least a part of the peripheral area. The encapsulation layer may include a first inorganic encapsulation layer, an organic encapsulation layer, and a second inorganic encapsulation layer.

A plurality of spacers 170 are spaced apart from each other on the pixel defining layer 150. In an exemplary embodiment, four spacers 170 are adjacent to each of the pixel electrodes 311R, 311G and 311B. For example, a pixel electrode 311R is disposed between two pixel electrodes arranged in a y-axis direction and between two pixel electrodes arranged in an x-axis direction. In this state, each of distances d1, d2, d3, and d4 between an edge of each of the spacers 170 in a direction toward the center of a closest pixel electrode and a portion of the closest pixel electrode not covered by the pixel defining layer 150 is about 3 μm or less. In an exemplary embodiment, the distances d1, d2, d3 and d4 may be the same distance of up to about 3 μm, for example. The present invention is not limited thereto. The distances d1 and d2 measured along the x-axis direction may be different from the distances d3 and d4 measured along the y-axis direction. The spacers 170 may include an organic material such as polyimide or hexamethyldisiloxane (HMDSO) or an inorganic material such as silicon oxide, silicon nitride, or silicon oxynitride. As described above, the counter electrode 315 that is integrally formed with respect to a plurality of pixels may be disposed on the spacers 170. A layer of the intermediate layers, which is integrally formed to a plurality of pixels, for example, the HIL or HTL, is disposed on the spacers 170.

Figure 4:
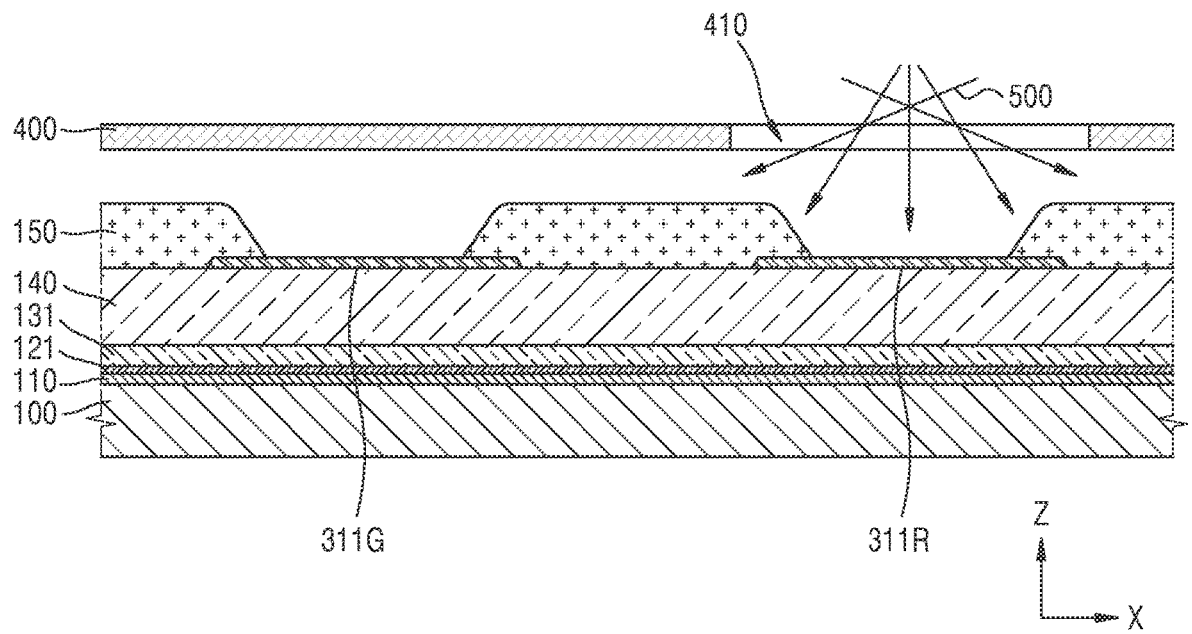
FIG. 4 is a schematic cross-sectional view of an operation of a manufacturing process of an organic light-emitting display apparatus according to a comparative example.

The EML may be deposited by using a mask 400 having a deposition opening 410, as illustrated in FIG. 4 in which no spacers 170 are present between the mask 400 and the pixel defining layer 150. FIG. 4 illustrates a case in which a red EML is formed on the pixel electrode 311R in a red pixel. As illustrated in FIG. 4, the red EML is deposited using the mask 400 vertically spaced apart from the pixel defining layer 150. In this case, however, as indicated by arrows 500 in FIG. 4, there may be a material for a red EML which passes through the deposition opening 410 of the mask 400 and then proceeds in a direction toward an adjacent pixel, for example, the pixel electrode 311G for green, not toward the pixel electrode 311R for red or therearound. Accordingly, a material for red emission may be disposed on the pixel electrode 311G for green or adjacent thereto. This may cause later that, after an organic light-emitting display apparatus is completed, a green pixel does not accurately emit green light only, but emits red light even if slightly along with the green light.

Figure 5:
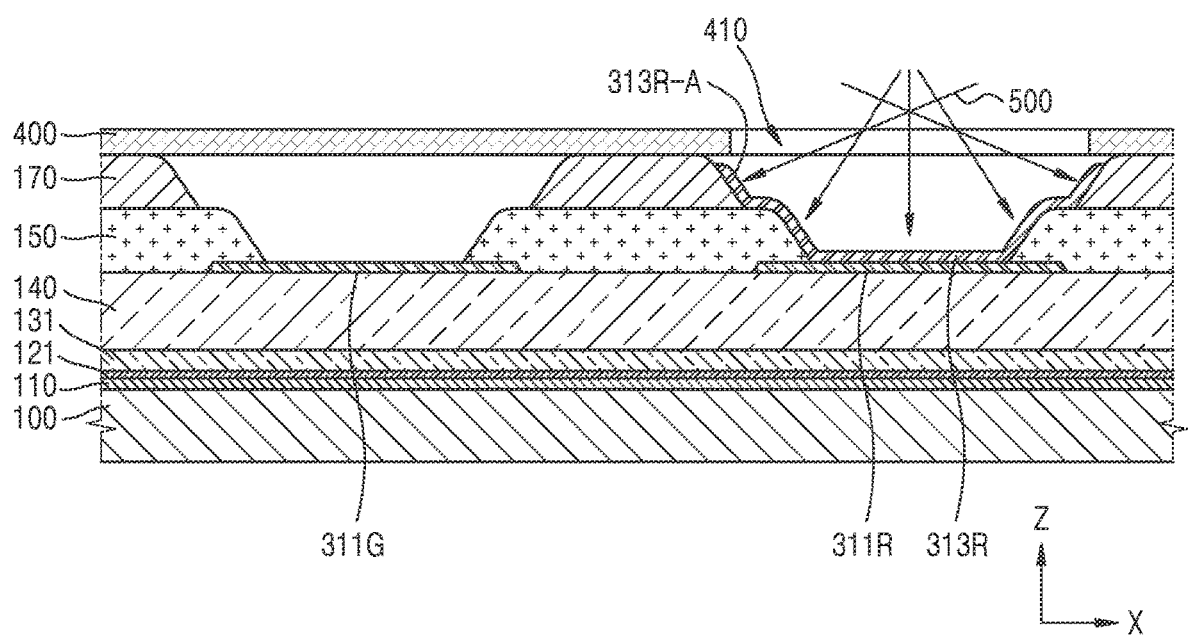
FIG. 5 is a schematic cross-sectional view of an operation of a manufacturing process of the organic light-emitting display apparatus of FIG. 1 according to an exemplary embodiment of the present inventive concept.

In an organic light-emitting display apparatus according to the present embodiment, the EML is to be deposited after the spacers 170 are provided between the mask 400 and the pixel defining layer 150, as illustrated in FIG. 5. The EML is deposited by using the mask 400 having the deposition opening 410 with the spacers filling a gap between the mask 400 and the pixel defining layer 150. FIG. 5 illustrates a case in which a red EML 313R is formed on the pixel electrode 311R in a red pixel. As illustrated in FIG. 5, the red EML 313R is deposited when the mask 400 is in contact with the spacers 170. In this case, as indicated by the arrows 500 in FIG. 5, a material for a red EML passes through the deposition opening 410 of the mask 400 and then proceeds in a direction toward an adjacent pixel, for example, the pixel electrode 311G for green, not toward the pixel electrode 311R for red or therearound. However, the material for the red EML 313R is blocked by the spacers 170 and is not allowed to proceed in a direction toward the pixel electrode 311G for green. Accordingly, in an organic light-emitting display apparatus according to the present embodiment, light of an accurately intended color coordinate may be emitted from each of a red pixel R, a green pixel G, and a blue pixel B.

In each of the spacers 170, as the distance d1, d2, d3, or d4 between the edge in a direction toward the closest pixel electrode, that is, the edge in a direction toward the center of the closest pixel electrode, and a portion of the closest pixel electrode that is not covered by the pixel defining layer 150 decreases as short as possible, when forming a specific EML, a material for the specific EML may be disposed selectively on a corresponding pixel electrode. As an increase in the distance d1, d2, d3, or d4 means that an area where a material for a specific EML is deposited increases when forming the specific EML, the material for an EML may be deposited even in an unnecessary area. In an exemplary embodiment, in each of the spacers 170, the distance d1, d2, d3, or d4 between the edge in a direction toward the center of the closest pixel electrode and the portion of the closest pixel electrode that is not covered by the pixel defining layer 150 is a distance up to about 3 μm.

In each of the spacers 170, when the distance d1, d2, d3, or d4 between the edge in a direction toward the closest pixel electrode, that is, the edge in a direction toward the center of the closest pixel electrode, and the portion of the closest pixel electrode that is not covered by the pixel defining layer 150 excessively decreases, a portion of the counter electrode 315 may be separated from another portion of the counter electrode 315 in a process of forming the counter electrode 315. For example, in each of the spacers 170, when the distance d1, d2, d3, or d4 between the edge in a direction toward the center of the closest pixel electrode and the portion of the closest pixel electrode that is not covered by the pixel defining layer 150 is 0 μm, this means that the counter electrode 315 covers a step with an increased slop. The step has a height that is a sum of the height of the pixel defining layer 150 and the height of the spacers 170. As the step's slope increases, a possibility that the counter electrode 315 may not be formed continuously to fill a space defined by the spacers 170 or the opening of the pixel defining layer 150 when forming the counter electrode 315 drastically increases. For example, in a process of forming the counter electrode 315, when the step's slope increases, a portion of the counter electrode 315 may be separated from another portion of the counter electrode 315 so that the focusing lens 190 may not be properly formed on the counter electrode 315.

To prevent such a problem, in each of the spacers 170, the distance d1, d2, d3, or d4 between the edge in a direction toward the closest pixel electrode, that is, the edge in a direction toward the center of the closest pixel electrode, and the portion of the closest pixel electrode that is not covered by the pixel defining layer 150 is about 1 µm or more. Accordingly, when forming the counter electrode 315, a small step corresponding to the height of the pixel defining layer 150 does not cause to separate a portion of the counter electrode 315 from another portion of the counter electrode 315 in a process of forming the counter electrode 315. Furthermore, in a portion from the pixel defining layer 150 to the spacers 170, the height of the spacers 170 with a smaller step's slope does not cause to separate a portion of the counter electrode 315 from another portion thereof in a process of forming the counter electrode 315.

As such, in each of the spacers 170, the distance d1, d2, d3, or d4 between the edge in a direction toward the closest pixel electrode, that is, the edge in a direction toward the center of the closest pixel electrode, and the portion of the closest pixel electrode that is not covered by the pixel defining layer 150 is a distance between about 1 µm and about 3 µm. In an exemplary embodiment, the distance d1, d2, d3, or d4 may be a distance of about 2 µm.

To ensure a shielding effect of the spacers 170 in the EML deposition process as illustrated in FIG. 5, the spacers 170 each may have an appropriate width w as illustrated in FIG. 1. For example, as illustrated in FIG. 1, a length of an edge (extending in a y-axis direction) of one of the spacers 170 adjacent to the pixel electrode 311B for blue may be defined as the width w of each of the spacers 170. The width w may be greater than or equal to the length of the edge (extending in the y-axis direction) of the pixel electrode 311B for blue closest to the spacers 170. The edge of the pixel electrode 311B for blue is defined by an exposed portion of the pixel electrode 311B for blue not covered by the pixel defining layer 150. For the convenience of description and simplicity of drawings, it is assumed that each of the spacers 170 is a square. The present inventive concept is not limited thereto. In an exemplary embodiment, each of the spacers 170 may be a rectangular or any shape that may have the shielding effect in the EML deposition process.

Referring to FIG. 5, as described above, in a process of depositing a red EML 130R, the mask 400 contacts the spacers 170. However, as an area of a portion of the mask 400 contacting the spacers 170 increases, a possibility of damaging the mask 400 may increase as well. Accordingly, the area of the portion of the mask 400 contacting the spacers 170 may be reduced as much as possible. To this end, as illustrated in FIG. 1, the spacers 170 are spaced apart from each other. For example, the spacers 170 are not connected to each other on the pixel defining layer 150.

As described above, in the red EML deposition process, a material for a specific EML may be prevented from being delivered in a direction toward an adjacent pixel electrode or may be reduced by using the spacers 170. Accordingly, each of the spacers 170 may be disposed between one pixel electrode and any one of the closest pixel electrodes to the one pixel electrode. For example, in FIG. 1, for the green pixel G, the closest pixels may be two red pixels R disposed adjacent to each other in a Y-axis direction and two blue pixels B disposed adjacent to each other in an X-axis direction. Accordingly, the spacers 170 are disposed between the pixel electrode 311G of the green pixel G and the pixel electrode 311B of the blue pixel B, and between the pixel electrode 311G of the green pixel G and the pixel electrode 311R of the red pixel R. For example, each of a plurality of pixel electrodes is surrounded by four spacers 170.

As illustrated in FIG. 1, a plurality of pixel electrodes may be disposed at intersections of a plurality of first virtual linear lines VL1 (extending in the X-axis direction) parallel to each other and a plurality of second virtual linear lines VL2 (extending in the Y-axis direction) parallel to each other and crossing the first virtual linear lines VL1. The spacers 170 are disposed along the plurality of first virtual linear lines VL1 or the plurality of second virtual linear lines VL2 to correspond to positions between the plurality of pixel electrodes. For example, the spacers 170 are disposed only on the plurality of first virtual linear lines VL1 or the plurality of second virtual linear lines VL2 to correspond to the positions between the plurality of pixel electrodes. In other words, the spacers 170 are not disposed between one pixel electrode of a plurality of pixel electrodes and pixel electrodes next tof the closest pixel electrodes to the one pixel electrode. In an exemplary embodiment, the plurality of spacers 170 include a plurality of first spacers that are disposed on the plurality of first virtual linear lines VL1 and a plurality of second spacers that are disposed on the plurality of second virtual linear lines VL2. Each of the plurality of first spacers is disposed between two adjacent pixel electrodes, arranged on a corresponding first virtual linear line VL1 of the plurality of first virtual linear lines VL1, of the plurality of pixel electrodes. Each of the plurality of second spacers is disposed between two adjacent pixel electrodes, arranged on a corresponding second virtual linear line VL2 of the plurality of second virtual linear lines VL2, of the plurality of pixel electrodes. In an exemplary embodiment, no spacer is present on a region adjacent, along a second virtual linear line, to one of the pair of first spacers and adjacent, along a first virtual linear line, to one of the pair of second spacers.

For example, for the green pixel G, the closest pixels are two blue pixels B in the X-axis direction and two red pixels R in the Y-axis direction. Pixels second closest to the green pixel G are four green pixels G. Each of two spacers 170 that are arranged in the X-axis direction is disposed between the green pixel G and a corresponding one of the two blue pixels B arranged in the X-axis direction, and each of two spacers 170 that are arranged in the Y-axis direction is disposed between the green pixel G and a corresponding one of the two red pixels R arranged in the Y-axis direction. No spacer is disposed between two green pixels G among the green pixel G and the four green pixels G. For the red pixel R, the closest pixels are four green pixels G disposed in the X-axis direction and the Y-axis direction, and pixels second closest to the red pixel R are four blue pixels B. Each of two spacers 170 that are arranged in the X-axis direction is disposed between the red pixel R and a corresponding one of the two green pixels G arranged in the X-axis direction, and each of two spacers 170 that are arranged in the Y-axis direction is disposed between the red pixel R and a corresponding one of the two green pixels G arranged in the Y-axis direction. No spacer is disposed between the red pixel R and each of the four blue pixels B. For the blue pixel B, the closest pixels are four green pixels G disposed in the X-axis direction and the Y-axis direction, and pixels second closest to the blue pixel B are four red pixels R. Each of two spacers 170 that are arranged in the X-axis direction is disposed between the blue pixel B and a corresponding one of the two green pixels G arranged in the X-axis direction, and each of two spacers 170 that are arranged in the Y-axis direction is disposed between the blue pixel B and a corresponding one of the two green pixels G arranged in the Y-axis direction. No spacer is disposed between the blue pixel B and each of the four red pixels R.

As the above description applies to a case in which the red pixel R, the blue pixel B, and the green pixel G are arranged as illustrated in FIG. 1, when the arrangement method is changed, a description about the locations of the spacers 170 may vary accordingly. However, in any case, the spacers 170 are disposed only on a plurality of first virtual linear lines VL1 or a plurality of second virtual linear lines VL2 to correspond to the positions between a plurality of pixel electrodes. Accordingly, a portion of an upper surface of the pixel defining layer 150 between one pixel electrode and pixels next to the closest pixel electrodes to the one pixel electrode, among the pixel electrodes 311R, 311G, and 311B, contacts the HIL or HTL without contacting a spacer 170. This is because the spacers 170 are not present in the portion. The portion where the spacers 170 are on the upper surface of the pixel defining layer 150 may directly contact the spacers 170.

As illustrated in FIG. 5, in a deposition process of depositing the red EML 313R, part of the material for the red EML 313R having passed through the deposition opening 410 of the mask 400 is blocked by the spacers 170 to be disposed on side surfaces of the spacers 170. Accordingly, in the organic light-emitting display apparatus according to the present embodiment, an auxiliary layer 313R-A including the same material as the material of the red EML 313R disposed on the closest pixel electrode may be disposed on the side surface of each of the spacers 170 in a direction toward the closest pixel electrode. As illustrated in FIG. 5, the red EML 313R may be formed on the pixel electrode 311R for red, and accordingly, the auxiliary layer 313R-A including the same material as the material of the red EML 313R may be formed on the side surfaces of each of the spacers 170 in a direction toward the pixel electrode 311R for red. Furthermore, the auxiliary layer 313R-A may be integrally formed with the red EML 313R on the pixel electrode 311R for red. This applies to pixels emitting the other color light such as blue and green.

In FIG. 1, each pixel is not a square or a rectangle, but has a shape having one chamfered corner. This is because, under a portion of the pixel defining layer 150 covering the chamfered portion, as illustrated in FIG. 2, the pixel electrodes 311B and 311R contact the thin film transistor 210 corresponding thereto through via holes. A pitch between pixels may relatively decrease in a higher resolution display in which the number of pixels per unit area increases. Accordingly, in a process of securing a contact area where the pixel electrodes 311B and 311R contact the thin film transistor 210 corresponding thereto through via holes, as illustrated in FIG. 1, each pixel is not a square or a rectangle, but has a shape having one chamfered corner.

Figure 6:
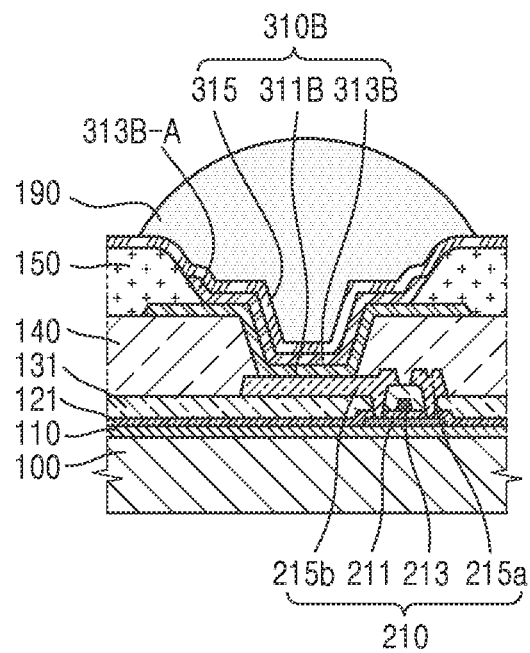
FIG. 6 is a schematic cross-sectional view of an organic light-emitting display apparatus according to an exemplary embodiment of the present inventive concept.

FIG. 6 is a schematic cross-sectional view of an organic light-emitting display apparatus according to an embodiment. Although FIG. 6 illustrates the blue organic light-emitting device 310B for blue for convenience of explanation, the disclosure is not limited thereto. The descriptions with reference to FIG. 6 may be applied to the red organic light-emitting device or the green organic light-emitting device.

The difference between the organic light-emitting display apparatus according to the present embodiment and the above-described organic light-emitting display apparatus is that a portion of the pixel electrode 311B disposed on the planarization layer 140 contacting any one of the source electrode 215*a* and the drain electrode 215*b* through a via hole is not covered by the pixel defining layer 150. For example, the portion of the pixel electrode 311B disposed on the planarization layer 140 contacting any one of the source electrode 215*a* and the drain electrode 215*b* does not vertically overlap the pixel defining layer 150. The EML 313B disposed on the pixel electrode 311B is disposed on the portion of the pixel electrode 311B contacting a thin film transistor. The EML 313B may be disposed on a portion other than the above portion of the pixel electrode 311B.

As described above, a pitch between pixels relatively decreases in a higher resolution display in which the number of pixels per unit area increases. Accordingly, it may not be easy to secure a contact area where the pixel electrode 311B contacts the thin film transistor 210 corresponding thereto through via holes. To solve the above problem, as illustrated in FIG. 6, the EML 313B disposed on the pixel electrode 311B may be disposed on the portion of the pixel electrode 311B contacting a thin film transistor 210.

In this case, as the EML 313B is disposed even on an inclined portion of the pixel electrode 311B. For example, the EML 313B is disposed on an inner surface of a via hole of the planarization layer 140, light emitted from the portion tends to proceed in an inclined direction, rather than in a direction approximately perpendicular to the substrate 100. As a result, as the light emitted from the EML 313B may excessively spread, the organic light-emitting display apparatus according to the present embodiment may further include a focusing lens 190, as illustrated in FIG. 6. The focusing lens 190 disposed above the pixel electrode 311B may prevent the excessive spread of the light emitted from the EML 313B by focusing the light generated from the EML 313B to travel in a direction opposite to a direction toward the pixel electrode 311B.

The center of the focusing lens 190 may match the center of the portion of the pixel electrode 311B contacting the thin film transistor 210, for example, the center of the portion of the pixel electrode 311B contacting the drain electrode 215*b*.

Figure 7:
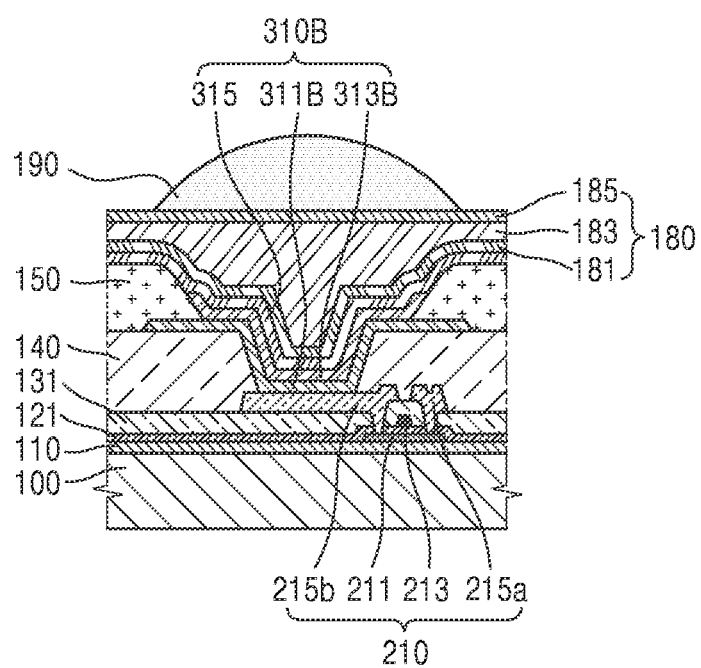
FIG. 7 is a schematic cross-sectional view of an organic light-emitting display apparatus according to an exemplary embodiment of the present inventive concept.

Although FIG. 6 illustrates that the focusing lens 190 is disposed on the counter electrode 315, the disclosure is not limited thereto. FIG. 7 is a schematic cross-sectional view of an organic light-emitting display apparatus according to an embodiment. As illustrated in FIG. 7, an encapsulation layer 180 may cover the organic light-emitting device to protect the organic light-emitting device, and the focusing lens 190 may be disposed on the encapsulation layer 180. The encapsulation layer 180 may cover a display area and extend to at least a part of the peripheral area. The encapsulation layer 180 may include a first inorganic encapsulation layer 181, an organic encapsulation layer 183, and a second inorganic encapsulation layer 185. The focusing lens 190 may be disposed on the second inorganic encapsulation layer 185. In an exemplary embodiment, a touch sensor layer for a touch screen function may be provided between the focusing lens 190 and the encapsulation layer 180.

According to the above-described embodiment configured as above, an organic light-emitting display apparatus in which color mixing is reduced may be implemented. Such an effect may not limit the scope of the present invention.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate;
   a plurality of thin film transistors disposed over the substrate;
   a planarization layer covering the plurality of thin film transistors and having a plurality of via holes for exposing a source electrode or a drain electrode of each of the plurality of thin film transistors;
   a plurality of pixel electrodes spaced apart from each other, each of the plurality of pixel electrodes including a first part and a second part, the first part contacting a corresponding one of the plurality of thin film transistors within a corresponding one of the plurality of via holes, the second part disposed on the planarization layer;
   a pixel defining layer disposed on the planarization layer and including a plurality of pixel defining holes exposing the plurality of pixel electrodes, wherein each of the plurality of pixel defining holes exposes a center portion and the first and second parts of a corresponding pixel electrode of the plurality of pixel electrodes;
   an intermediate layer including a first portion and a second portion, the first portion being disposed on the first part of one pixel electrode of the plurality of pixel electrodes within a corresponding one of the plurality of via holes, the second portion being disposed on the second part of one pixel electrode of the plurality of pixel electrodes; and
   a focusing lens disposed over the one pixel electrode and focusing light generated from the intermediate layer and proceeding in a direction away from the pixel electrode.

2. The organic light-emitting display apparatus of claim 1, further comprising:
   a plurality of spacers disposed on the pixel defining layer and, when viewed in a plan view, physically separated from each other, wherein a height of each of the plurality of spacers is less than a height of the pixel defining layer; and
   an auxiliary layer disposed on a side surface of each of the plurality of spacers in a direction toward a center of a closest pixel electrode, the auxiliary layer including a material that is the same as a material of an emission layer disposed on the closest pixel electrode.

3. The organic light-emitting display apparatus of claim 2, wherein a distance between an edge of each of the plurality of spacers adjacent to the closest pixel electrode and a portion of the closest pixel electrode that is not covered by the pixel defining layer is between about 1 μm and about 3 μm.

4. The organic light-emitting display apparatus of claim 2, wherein a distance between an edge of each of the plurality of spacers adjacent to the closest pixel electrode and a portion of the closest pixel electrode that is not covered by the pixel defining layer is about 2 μm.

5. The organic light-emitting display apparatus of claim 2, wherein each of the plurality of spacers is disposed between a corresponding pixel electrode of the plurality of pixel electrodes and one of pixel electrodes closest to the corresponding pixel electrode.

6. The organic light-emitting display apparatus of claim 2, wherein the plurality of pixel electrodes are disposed at intersections of a plurality of first virtual linear lines parallel to each other and a plurality of second virtual linear lines parallel to each other and crossing the plurality of first virtual linear lines, and
   wherein the plurality of spacers include a plurality of first spacers that are disposed on the plurality of first virtual linear lines and a plurality of second spacers that are disposed on the plurality of second virtual linear lines,
   wherein each of the plurality of first spacers is disposed between two adjacent pixel electrodes, arranged on a corresponding first virtual linear line of the plurality of first virtual linear lines, of the plurality of pixel electrodes,
   wherein each of the plurality of second spacers is disposed between two adjacent pixel electrodes, arranged on a corresponding second virtual linear line of the plurality of second virtual linear lines, of the plurality of pixel electrodes.

7. The organic light-emitting display apparatus of claim 2, wherein each of the plurality of pixel electrodes is surrounded by four spacers closest thereto.

8. The organic light-emitting display apparatus of claim 2, wherein the auxiliary layer is integrally formed with the emission layer.

9. The organic light-emitting display apparatus of claim 2, wherein each pixel electrode of the plurality of pixel electrodes, when viewed in a plan view, is surrounded by corresponding multiple spacers of the plurality of spacers, and
   wherein the corresponding multiple spacers are physically separated from each other.

10. The organic light-emitting display apparatus of claim 2, wherein the plurality of spacers include a different material from the pixel defining layer.

11. The organic light-emitting display apparatus of claim 10, wherein the plurality of spacers include an inorganic material.

12. The organic light-emitting display apparatus of claim 1, wherein a center of the focusing lens matches a center of the second part of the one pixel electrode.

13. The organic light-emitting display apparatus of claim 1, further comprising a common electrode disposed over the intermediate layer to correspond to the plurality of pixel electrodes,
   wherein the focusing lens is disposed on the common electrode to directly contact the common electrode.

14. The organic light-emitting display apparatus of claim 1,
   a common electrode disposed over the intermediate layer to correspond to the plurality of pixel electrodes; and
   an encapsulation layer disposed over the common electrode,
   wherein the focusing lens is disposed on the encapsulation layer to directly contact the encapsulation layer.

* * * * *